United States Patent
Wang et al.

(10) Patent No.: US 7,511,579 B2
(45) Date of Patent: Mar. 31, 2009

(54) PHASE LOCK LOOP AND OPERATING METHOD THEREOF

(75) Inventors: Chung-Cheng Wang, Taipei County (TW); Chao-Shi Chuang, Tainan (TW); Yi-Chuan Liu, Taipei (TW)

(73) Assignee: Airoha Technology Corp., Hsinchu (TW)

( * ) Notice: Subject to any disclaimer, the term of this patent is extended or adjusted under 35 U.S.C. 154(b) by 61 days.

(21) Appl. No.: 11/455,730

(22) Filed: Jun. 20, 2006

(65) Prior Publication Data

US 2007/0001770 A1    Jan. 4, 2007

(30) Foreign Application Priority Data

Jun. 20, 2005    (TW) ............................... 94120415 A

(51) Int. Cl.
*H03L 7/08* (2006.01)
(52) U.S. Cl. ............................ 331/16; 331/11; 327/156
(58) Field of Classification Search ............... 331/11, 331/17, 16; 327/156
See application file for complete search history.

(56) References Cited

U.S. PATENT DOCUMENTS

| | | | |
|---|---|---|---|
| 4,365,349 A | 12/1982 | Ogita et al. | |
| 6,127,896 A | 10/2000 | Burzio | |
| 6,259,327 B1 | 7/2001 | Balistreri et al. | |
| 6,563,387 B2 * | 5/2003 | Hirano et al. | 331/11 |
| 6,597,249 B2 * | 7/2003 | Chien et al. | 331/177 R |
| 6,710,664 B2 * | 3/2004 | Humphreys et al. | 331/11 |
| 6,903,613 B1 * | 6/2005 | Mitchell et al. | 331/11 |
| 7,047,146 B2 * | 5/2006 | Chuang et al. | 702/106 |
| 7,154,344 B2 * | 12/2006 | Thies et al. | 331/16 |
| 2002/0036545 A1 * | 3/2002 | Fridi et al. | 331/17 |

FOREIGN PATENT DOCUMENTS

TW    595105 B    6/2004

* cited by examiner

*Primary Examiner*—Robert Pascal
*Assistant Examiner*—Levi Gannon
(74) *Attorney, Agent, or Firm*—Birch, Stewart, Kolasch & Birch, LLP

(57) ABSTRACT

A PLL is provided, comprising a first divider, a PFD, a loop filter, a VCO, a second divider and a controller. The first divider receives a reference signal and divides the reference signal by R to obtain a divided signal. The PFD compares the divided signal and a feedback signal to generate a compared The VCO selects one of a plurality of operating curves for oscillation based on a selection signal, and generates an oscillation signal based on an operating voltage generated by signal the loop filter. The second divider divides the oscillation signal by N to obtain the feedback signal. The controller operates in an initial mode to recursively determine the selection signal by calculating differences of the feedback signal and the divided signal. When the selection signal converges to stable, the PLL switches to a normal mode to operate on the corresponding operating curve.

14 Claims, 6 Drawing Sheets

PHASE LOCK LOOP AND OPERATING METHOD THEREOF

BACKGROUND

The invention relates to electronic circuits, and in particular, to a multi-operating curve phase lock loop (PLL) and operating method thereof.

Current signal processing technologies are capable of processing the gigahertz frequency, and a PLL is the basis for a wide range of high frequency applications. By inputting a low frequency reference signal, a PLL generates a high frequency oscillation signal having a constant phase relationship with the reference signal.

FIG. 1 is a conventional PLL block diagram. A reference signal $f_{ref}$ is input to the PLL and as a result, an oscillation signal $f_{OSC}$ is output. The reference signal $f_{ref}$ is divided by R in the first divider 102, generating a corresponding divided signal $f'_{ref}$. The phases or frequencies of the divided signal $f'_{ref}$ and a feedback signal $f_{back}$ are compared in a phase/frequency detector (PFD) 104, and the differences thereof generate a charging/sinking current. The loop filter 106 converts the current to an operating voltage $V_{LF}$. A voltage controlled oscillator (VCO) 108 generates an oscillation signal $f_{OSC}$ based on the operating voltage $V_{LF}$. The oscillation signal $f_{OSC}$ is further divided by N by the second divider 110, and the result is the feedback signal $f_{back}$.

In order to provide oscillation signals of wider range frequencies, multi operating curves are developed on conventional PLLs. A desired oscillation frequency may be obtained by switching to an appropriate operating curve for an operation of the VCO.

FIG. 2 shows multi-operating curves of a conventional PLL. The VCO 108 comprises a plurality of operating curves each corresponding to an effective frequency range. Thus the PLL provides wide working range and improved flexibility. In the VCO 108, the operating voltage $V_{LF}$ is input and the oscillation signal $f_{OSC}$ is generated according to one of the operating curves VCO1 to VCOn. An effective method for selecting an appropriate VCO 108 for a desired oscillation signal $f_{OSC}$ is desirable.

SUMMARY

An exemplary embodiment of a PLL comprises a first divider; a PFD; a loop filter; a VCO; a second divider and a controller. The first divider receives a reference signal and divides the reference signal by R to obtain a divided signal. The PFD compares the divided signal and a feedback signal to generate a compared signal. The loop filter coupled to the loop filter, generates an operating voltage. The VCO selects one of a plurality of operating curves for oscillation based on a selection signal, and generates an oscillation signal based on the operating voltage. Each operating curve corresponds to a frequency range. The second divider divides the oscillation signal by N to obtain the feedback signal. The controller operates in an initial mode to recursively determine the selection signal by calculating differences of the feedback signal and the divided signal based on a reference clock. When the selection signal converges to stable, the PLL switches to a normal mode to operate on the corresponding operating curve selected by the selection signal.

In the initial mode, the controller further generates a division signal to rise the values of R and N by A times. The PLL may further comprise a third divider dividing the oscillation signal by M to generate the reference clock in the initial mode. The third divider and the controller are disabled in the normal mode. The value of M may range from 2 to 4. A voltage source may further be included, providing the operating voltage in the initial mode. The voltage source is also disabled in the normal mode.

The controller comprises a first and a second enabler, a first and a second counter, a comparator and a tuner. The first enabler receives the feedback signal to assert a first enable signal. The second enabler receives the divided signal to assert a second enable signal. The first counter enabled by the first enable signal, counts the reference clock during the enablement to generate a first number. The second counter enabled by the second enable signal, counts the reference clock during the enablement to generate a second number. The comparator compares the first number and the second number to generate an error signal. The tuner generates the selection signal based on the error signal.

The first enabler determines the first counter enable duration based on a multiple of the feedback signal cycle time, and the second enabler determines the second counter enable duration based on a multiple of the divided signal cycle time. The first enabler and the second enabler further receive a control signal to determine the multiple ratio.

The tuner may determine the selection signal by a binary search algorithm. The error signal may be a logic value indicating whether the first number is greater than the second number. When the error signal is in a first status, the value of the selection signal is increased to choose a higher frequency operating curve. When the error signal is in a second status, the value of the selection signal is decreased to choose a lower frequency operating curve. The tuner further comprises a finite state machine determining whether the selection signal is converged to stable, and if yes, switches to the normal mode, and if no, outputs the selection signal and recursively performs the comparison.

Another embodiment of the invention provides a PLL operating method for a PLL comprising a plurality of operating curves. In an initial mode, a reference signal is received and divided by the reference signal by AR to obtain a divided signal. An oscillation signal is generated based on a default operating point on a default operating curve. The oscillation signal is divided by AN to obtain a feedback signal. The feedback signal and the divided signal are compared. If a comparison result does not meet a condition, another operating curve is selected based on the comparison result, and another oscillation signal is generated. If the comparison result meets the condition, the PLL switches to a normal mode. In the normal mode, the oscillation signal is generated from the operating curve determined by the comparison result. The reference signal is divided by R to generate the divided signal, and the oscillation signal is divided by N to generate the feedback signal.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION

Figure 2:
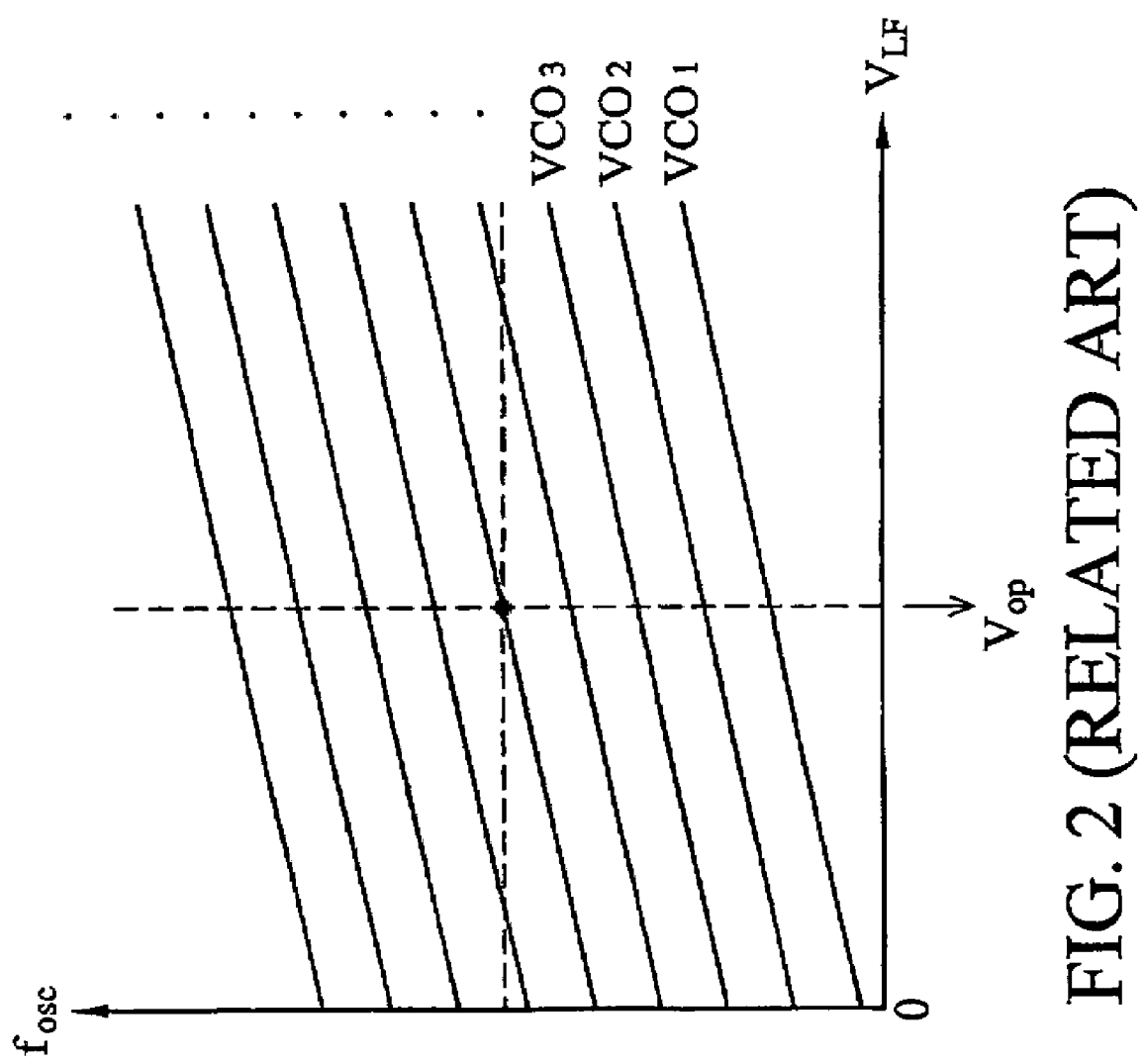
FIG. 2 shows multi-operating curves of a conventional PLL.
Figure 3:
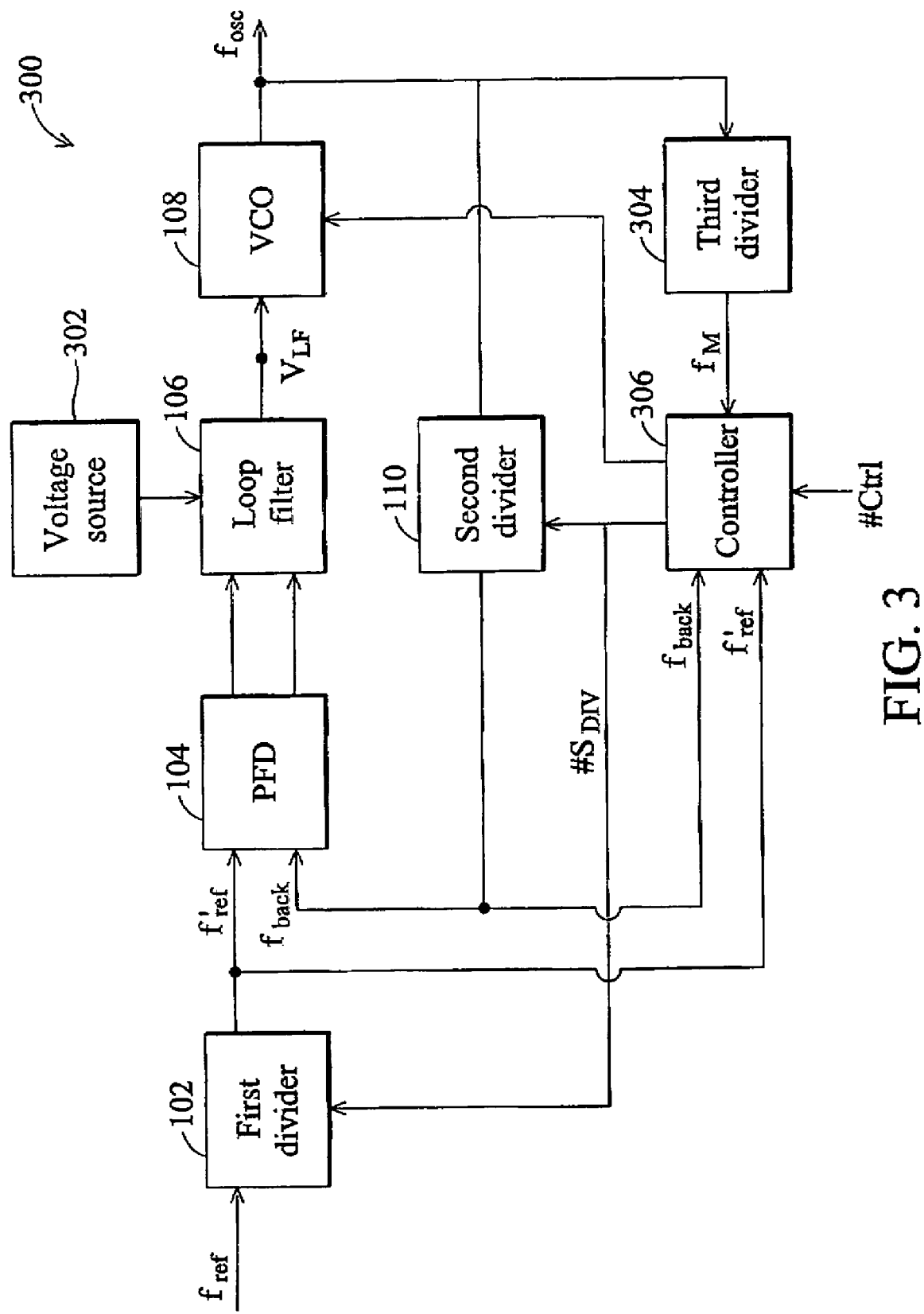
FIG. 3 shows an embodiment of the PLL circuit.

FIG. 3 shows an embodiment of the PLL circuit. A voltage source 302, a third divider 304 and a controller 306 are provided to the PLL 300. The PLL 300 operates in two modes, an initial mode and a normal mode. In the initial mode, a voltage source 302, third divider 304 and a controller 306 are enabled to rapidly determine an appropriate operating curve. When the operating curve is determined, the PLL 300 switches to the normal mode to operate as a conventional PLL. In the initial mode, a voltage source 302 first charges the loop filter 106 to a predetermined level, such that the loop filter 106 generates an operating voltage $V_{LF}$ of a corresponding potential, such as the $V_{OP}$ in the FIG. 2. The potential fixes the operating point, such that the following operating curve search is facilitated.

Figure 1:
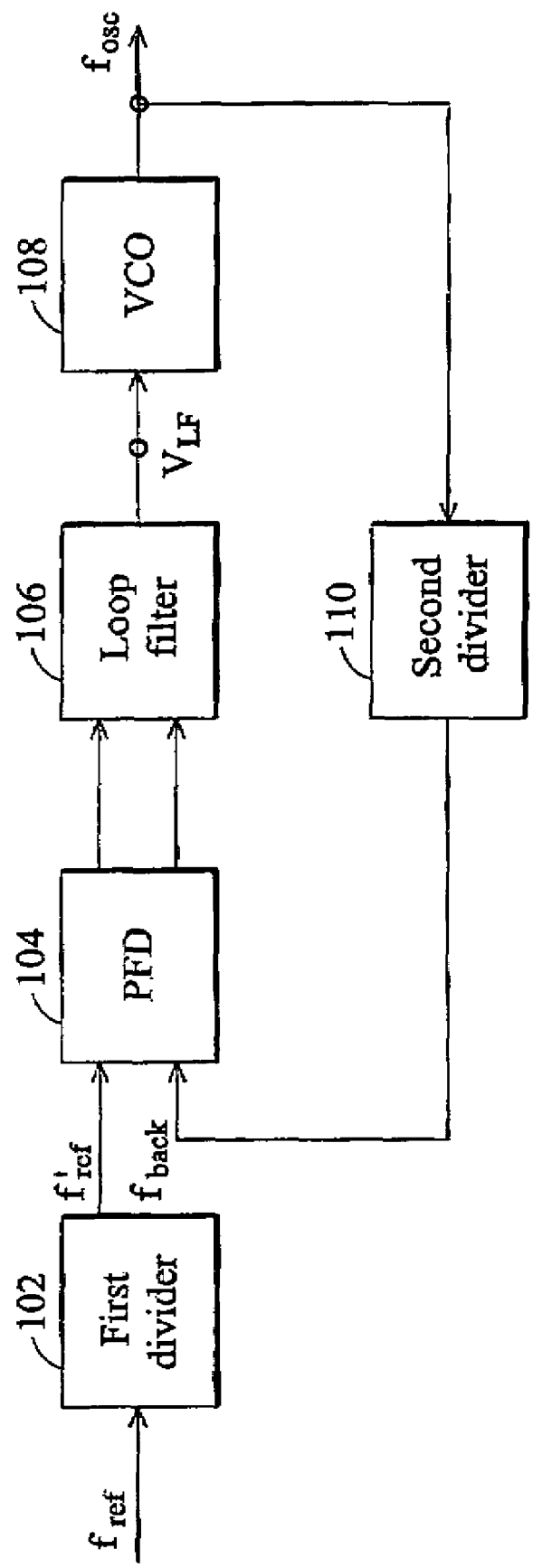
FIG. 1 is a conventional PLL block diagram.

The controller 306 then sends a division signal $\#S_{DIV}$ to the first divider 102 and second divider 110, converting the division ratios of the first divider 102 from 1/R to 1/AR, and the second divider 110 from 1/N to 1/AN. In this way, a divided signal $f_{ref}$ generated by the first divider 102, and the feedback signal $f_{back}$ generated by the second divider 110 are provided with smaller values, thus a more precise comparison can be performed. The values of divided signal $f_{ref}$ and feedback signal $f_{back}$ are smaller by A times than those in the normal mode, therefore the sensitivity for difference detection is higher. A reference clock $F_M$ is taken as a basis for counting the cycle time of the feedback signal $f_{back}$ and the divided signal $f_{ref}$. The reference clock $F_M$ can be generated by a third divider 304 dividing the oscillation signal $f_{OSC}$ by M. The counting results of the feedback signal $f_{back}$ and divided signal $f_{ref}$ are compared to determine the differences therebetween, thus a corresponding $\#S_{VCO}$ can be generated to drive the VCO 108 with a more appropriate operating curve. For example, if the cycle time of the feedback signal $f_{back}$ exceeds the divided signal $f_{ref}$, a higher frequency operating curve should be selected. Conversely, if the cycle time of the feedback signal $f_{back}$ is lower than the divided signal $f_{ref}$, a lower frequency operating curve is selected. The controller 306 recursively determines the counting results and updates the selection signal $\#S_{VCO}$ until a converged stable state is found. Thereafter, the PLL 300 switches to the normal mode to operate with the newest selected operating curve, and the voltage source 302, third divider 304 and controller 306 are disabled. In the normal mode, the division ratio in the first divider 102 and second divider 110 are restored to 1/R and 1/N, and the PLL 300 operates as a conventional PLL in FIG. 1.

Figure 4:
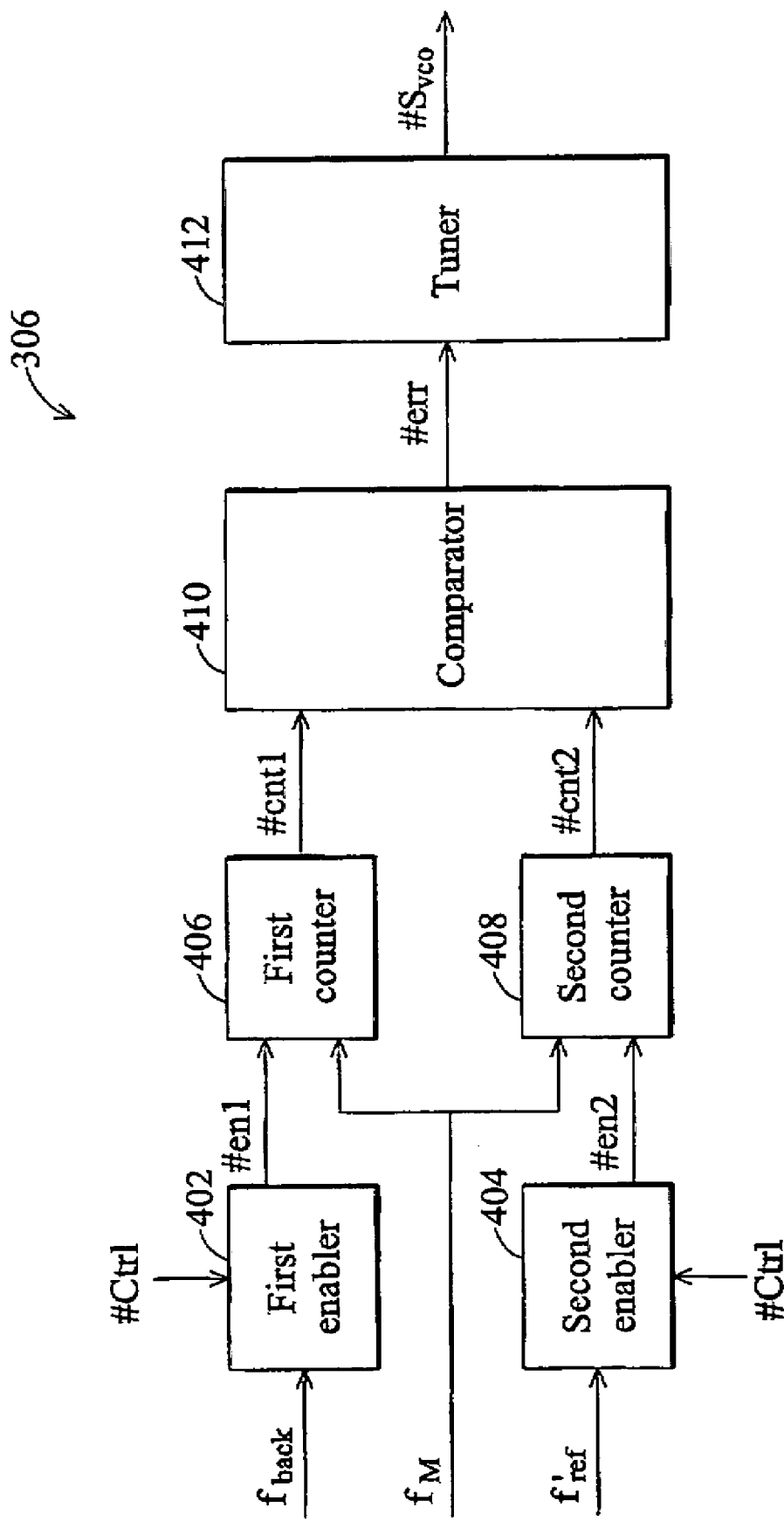
FIG. 4 shows an embodiment of the controller 306.

FIG. 4 shows an embodiment of the controller 306. The controller 306 comprises a first enabler 402, a second enabler 404, a first counter 406, a second counter 408, a comparator 410 and a tuner 412. The second divider 110 and the first divider 102 provide the feedback signal $f_{back}$ and divided signal $f_{ref}$ to the first enabler 402 and second enabler 404 to convert to a first enable signal #en1 and a second enable signal #en2. The first counter 406 and second counter 408 count the first enable signal #en1 and second enable signal #en2 based on a reference clock $F_M$. The feedback signal $f_{back}$ and divided signal $f_{ref}$ are periodic signals each having a cycle time. The first enable signal #en1 and the second enable signal #en2 are asserted for a period which is a multiple of the cycle times, and the multiple ratio may be determined by an external control signal #ctr1. The reference clock $F_M$ is a common counting basis. During assertion of the first enable signal #en1, the first counter 406 counts the reference clock $F_M$ to obtain a first number #cnt1. During assertion of the second enable signal #en2, a second number #cnt2 is counted by a second counter 408. A comparator 410 compares the first number #cnt1 and the second number #cnt2, generating an error signal #err to indicate which is greater. The comparator 410 can be a subtracting unit. The tuner 412 then determines a selection signal $\#S_{VCO}$ according to the error signal #err, and an operating curve in the VCO 108 is selected by the selection signal $\#S_{VCO}$. For example, a VCO 108 may comprise 1024 operating curves numbered from VCO1 to VCO1024, representing a working range from low frequency to high frequency. The tuner 412 utilizes a binary search scheme to obtain rapid convergence. The search is initialized by selecting VCO512 as a default operating curve. If an error signal #err is generated indicating the cycle time of the feedback signal $f_{back}$ is longer than that of divided signal $f_{ref}$, a selection signal $\#S_{VCO}$ is generated to tell the VCO 108 to choose a higher frequency operating curve, such as VCO768. With an error signal #err generated from the second iteration, the cycle time of feedback signal $f_{back}$ is found to be shorter than that of a divided signal $f_{ref}$, thus another selection signal $\#S_{VCO}$ is generated to tell the VCO 108 to choose a lower frequency operating curve, such as VCO640. In this binary search method, the VCO 108 is quickly converged to stable, and a most appropriate operating curve can be rapidly found. The tuner 412 may be a state machine determining how to choose the operating curve based on the selection signal $\#S_{VCO}$.

Figure 5:
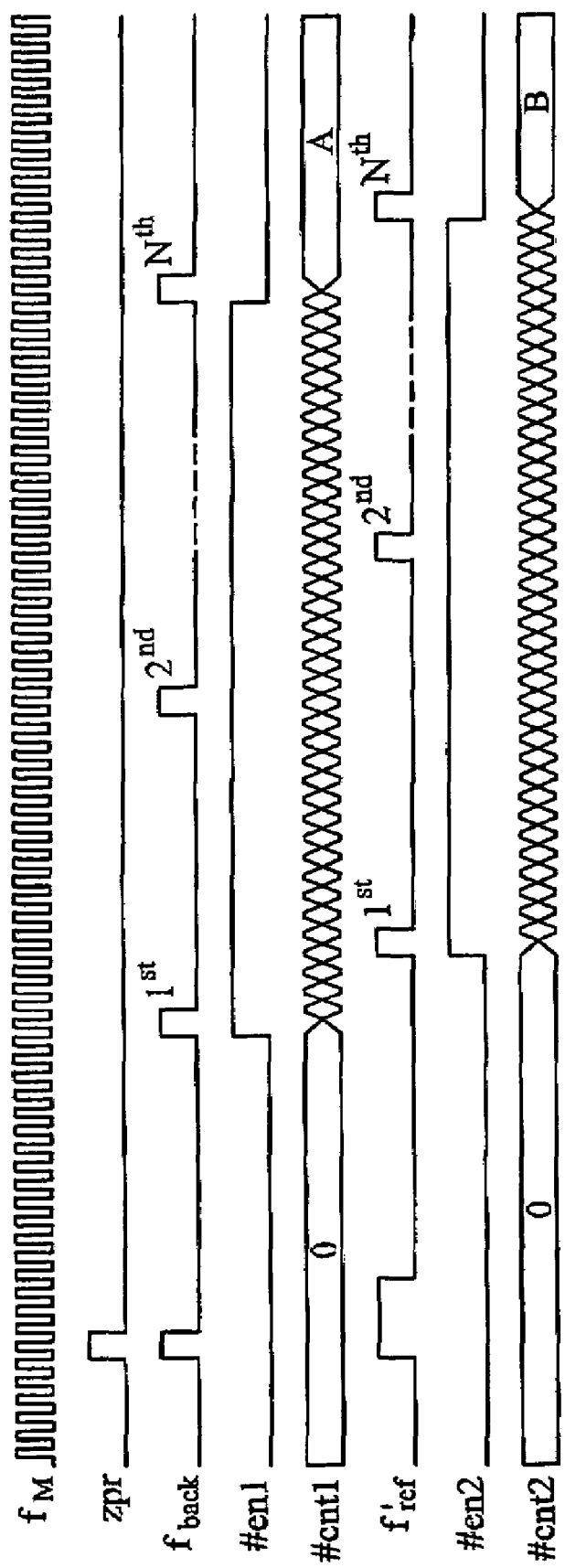
FIG. 5 is a timing chart of the signal enablement.

FIG. 5 is a timing chart of the signal enablement. The reference clock $F_M$ may be generated by dividing the oscillation signal $f_{OSC}$ by M, thus no additional hardware is required to provide the clock. For a sensitive comparison, the value of M may range from 2 to 4. In FIG. 5, during assertion of the first enable signal #en1 and second enable signal #en2, the reference clock $F_M$ are separately counted to generate the first number #cnt1 and the second number #cnt2. The first number #cnt1 and second number #cnt2 may not be simultaneously counted, thus the comparator 410 waits until both counting results are available, and the error signal #err is then determined for the tuner 412.

Figure 6:
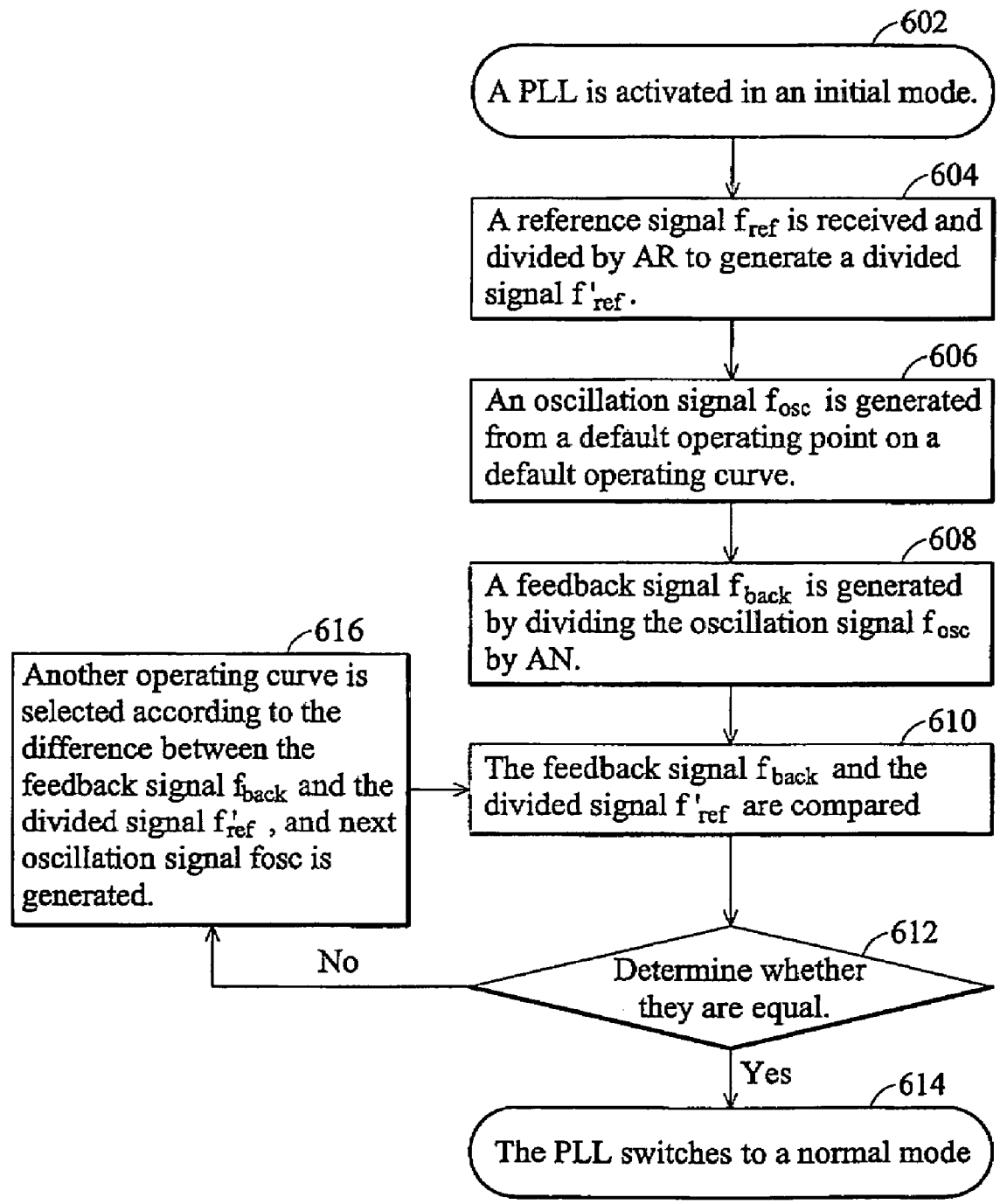
FIG. 6 is a flowchart of the PLL operating method.

FIG. 6 is a flowchart of the PLL operating method. In step 602, a PLL is activated in an initial mode. In step 604, a reference signal $f_{ref}$ is received and divided by AR to generate a divided signal $f_{ref}$. In step 606, an oscillation signal $f_{OSC}$ is generated from a default operating point on a default operating curve. In step 608, a feedback signal $f_{back}$ is generated by dividing the oscillation signal $f_{OSC}$ by AN. In step 610, the feedback signal $f_{back}$ and the divided signal $f_{ref}$ are compared to determine whether they are equal. Step 612, if yes, the PLL switches to a normal mode in step 614, and If not, step 616 is carried out. In step 616, another operating curve is selected according to the difference between the feedback signal $f_{back}$ and the divided signal $f_{ref}$, and the next oscillation signal $f_{OSC}$ is generated for the next comparison. In the normal mode, the PLL operates as conventional PLL. The reference signal $f_{ref}$ division ratio of AR in the initial mode, is changed to R in the normal mode. The AN of feedback signal $f_{back}$ is changed to N. The error signal #err in FIG. 4 may be a logic value indicating which number is larger. For example, the error signal #err represents the polarity of first number #cnt1 subtracted from the second number #cnt2.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase lock loop (PLL), comprising:
   a first divider configured to receive a reference signal and to divide the reference signal by a value R to obtain a divided signal;
   a phase/frequency detector (PFD) configured to compare the divided signal and a feedback signal to generate a compared signal;
   a loop filter, coupled to the phase/frequency detector configured to generate an operating voltage;
   a voltage controlled oscillator (VCO) configured to select one of a plurality of operating curves for oscillation based on a selection signal, and to generate an oscillation signal based on the operating voltage, wherein each operating curve corresponds to a frequency range;
   a second divider configured to divide the oscillation signal by a value N to obtain the feedback signal;
   a controller configured to operate in an initial mode to increase the values of R and N by a factor of A after the PLL is initially charged and to then recursively determine the selection signal by calculating differences between the feedback signal and the divided signal based on a reference clock; wherein
   when the selection signal converges to a stable value, the PLL is configured to switch to a normal mode to operate on one of a plurality of predetermined operating curves, the operating curve corresponding to the selection signal,
   the PLL further comprising:
   a third divider configured to divide the oscillation signal by M to generate the reference clock in the initial mode;
   wherein the third divider and the controller are disabled in the normal mode.

2. The PLL as claimed in claim 1, wherein value of M ranges from 2 to 4.

3. A phase lock loop (PLL), comprising:
   a first divider configured to receive a reference signal and to divide the reference signal by a value R to obtain a divided signal;
   a phase/frequency detector (PFD) configured to compare the divided signal and a feedback signal to generate a compared signal;
   a loop filter, coupled to the phase/frequency detector configured to generate an operating voltage;
   a voltage controlled oscillator (VCO) configured to select one of a plurality of operating curves for oscillation based on a selection signal, and to generate an oscillation signal based on the operating voltage, wherein each operating curve corresponds to a frequency range;
   a second divider configured to divide the oscillation signal by a value N to obtain the feedback signal;
   a controller configured to operate in an initial mode to increase the values of R and N by a factor of A after the PLL is initially charged and to then recursively determine the selection signal by calculating differences between the feedback signal and the divided signal based on a reference clock; wherein
   when the selection signal converges to a stable value, the PLL is configured to switch to a normal mode to operate on one of a plurality of predetermined operating curves, the operating curve corresponding to the selection signal,
   the PLL further comprising:
   a voltage source configured to provide the operating voltage in the initial mode; wherein The voltage source is disabled in the normal mode.

4. A phase lock loop (PLL), comprising:
   a first divider configured to receive a reference signal and to divide the reference signal by a value R to obtain a divided signal;
   a phase/frequency detector (PFD) configured to compare the divided signal and a feedback signal to generate a compared signal;
   a loop filter, coupled to the phase/frequency detector configured to generate an operating voltage;
   a voltage controlled oscillator (VCO) configured to select one of a plurality of operating curves for oscillation based on a selection signal, and to generate an oscillation signal based on the operating voltage, wherein each operating curve corresponds to a frequency range;
   a second divider configured to divide the oscillation signal by a value N to obtain the feedback signal;
   a controller configured to operate in an initial mode to increase the values of R and N by a factor of A after the PLL is initially charged and to then recursively determine the selection signal by calculating differences between the feedback signal and the divided signal based on a reference clock; wherein
   when the selection signal converges to a stable value, the PLL is configured to switch to a normal mode to operate on one of a plurality of predetermined operating curves, the operating curve corresponding to the selection signal,
   wherein the controller comprises:
   a first enabler configured to receive the feedback signal to assert a first enable signal;
   a second enabler configured to receive the divided signal to assert a second enable signal;
   a first counter, enabled by the first enable signal, configured to enable the reference clock during the enablement to generate a second number;
   a second counter, enabled by the second enable signal, configured to count the reference clock during the enablement to generate a second number;
   a comparator configured to compare the first number and the second number to generate an error signal; and
   a tuner configured to generate the selection signal based on error signal.

5. The PLL as claimed in claim 4, wherein:
   the first enabler is configured to determine the first counter enable duration based on a multiple of a feedback signal cycle time;
   the second enabler is configured to determine the second counter enable duration based on a multiple of a divided signal cycle time; and
   the first enabler and the second enabler are configured to receive a control signal to determine a multiple ratio.

6. The PLL as claimed in claim 4, wherein the tuner is configured to determine the selection signal by a binary search algorithm.

7. The PLL as claimed in claim 6, wherein:
   the error signal is a logic value indicating whether the first number is greater than the second number;
   when the error signal is in a first status, increasing the value of the selection signal to chose a higher frequency operating curve; and
   when the error signal is in a second status, decreasing the value of the selection signal to chose a lower frequency operating curve.

8. The PLL as claimed in claim 7, wherein the tuner further comprises:
   a finite state machine configured to determine whether the selection signal is converged to the stable value.

9. A method for operating a PLL (Phase Lock Loop) comprising a plurality of operating curves, comprising:
   in an initial mode:
   initially charging the PLL, including
   receiving a reference signal and dividing the reference signal by a value R;
   generating an oscillation signal;
   dividing the oscillation signal by a value N;
   multiplying the values R and N by a factor A after the PLL is charged;
   receiving a reference signal and dividing the reference signal by a value AR to obtain a divided signal;
   generating an oscillation signal based on a first default operating point on a first default operating curve;
   dividing the oscillation signal by a value AN to obtain a feedback signal;
   comparing the feedback signal and the divided signal to generate a comparison result;
   if the comparison result does not meet a predetermined condition, determining a selection signal, selecting another operating curve based on the selection signal, and
   repeating said steps of dividing and comparing based on a second default operating point,
   the second default operating point on one of the first default operating curve and a second default operating curve;
   if the comparison result meets the predetermined condition, switching to a normal mode; and
   in the normal mode:
   generating the oscillation signal from an operating curve determined by the comparison result,
   wherein the comparison of the feedback signal and the divided signal comprises:
   generating a reference clock;
   asserting a first enable signal having a duration equal to a multiple of a feedback signal cycle time;
   asserting a second enable signal having a duration equal to a multiple of a divided signal cycle time;
   in a time period when the first enable signal is asserted, counting the reference clock to obtain a first number;
   in a time period when the second enable signal is asserted, counting the reference clock to obtain a second number;
   comparing the first number and the second number to generate an error signal; and
   selecting one of the plurality of operating curves as the first default operating curve based on the error signal.

10. The method as claimed in claim 9, wherein the step of generating a reference clock comprises:
   dividing the oscillation signal by a value M to obtain the reference clock.

11. The method as claimed in claim 10, wherein a value of M ranges from 2 to 4.

12. The method as claimed in claim 9, further comprising receiving a control signal to determine a multiple ratio.

13. The method as claimed in claim 9, wherein the step of determining the selection signal comprises:
   determining the selection signal with a binary search algorithm.

14. The method as claimed in claim 9, wherein:
   the error signal indicates whether the first number is greater than the second number;
   the method further comprising:
   when the error signal is in a first state, increasing a value of the selection signal to chose a higher frequency operating curve; and
   when the error signal is in a second state, decreasing the value of the selection signal to chose a lower frequency operating curve.

* * * * *